US012753505B2

(12) United States Patent
Boyd

(10) Patent No.: US 12,753,505 B2
(45) Date of Patent: Oct. 6, 2026

(54) GAS INLET ELEMENT OF A CVD REACTOR WITH TWO INFEED POINTS

(71) Applicant: AIXTRON SE, Herzogenrath (DE)

(72) Inventor: Adam Boyd, Kelmis (BE)

(73) Assignee: AIXTRON SE, Herzogenrath (DE)

( * ) Notice: Subject to any disclaimer, the term of this patent is extended or adjusted under 35 U.S.C. 154(b) by 102 days.

(21) Appl. No.: 18/024,470

(22) PCT Filed: Sep. 2, 2021

(86) PCT No.: PCT/EP2021/074235
§ 371 (c)(1),
(2) Date: Mar. 2, 2023

(87) PCT Pub. No.: WO2022/049182
PCT Pub. Date: Mar. 10, 2022

(65) Prior Publication Data

US 2023/0323537 A1 Oct. 12, 2023

(30) Foreign Application Priority Data

Sep. 3, 2020 (DE) ..................... 10 2020 123 076.1

(51) Int. Cl.
*C23C 16/455* (2006.01)
*C23C 16/52* (2006.01)

(52) U.S. Cl.
CPC .... *C23C 16/4558* (2013.01); *C23C 16/45574* (2013.01); *C23C 16/52* (2013.01)

(58) Field of Classification Search
CPC .......... C23C 16/4558; C23C 16/45574; C23C 16/52; C23C 16/45561; C23C 16/45512; C23C 16/45565; C23C 16/45576
See application file for complete search history.

(56) References Cited

U.S. PATENT DOCUMENTS 5,607,725 A * 3/1997 Goodman ............. C23C 16/453
427/166
6,161,500 A 12/2000 Kopacz et al.
(Continued)

FOREIGN PATENT DOCUMENTS

CN 101499407 B 7/2010
DE 19851824 A1 5/2000
(Continued)

OTHER PUBLICATIONS

Written Opinion mailed Mar. 7, 2022, from the ISA/European Patent Office, for International Patent Application No. PCT/EP2021/074235 (filed Sep. 2, 2021), English translation, 24 pgs.
(Continued)

*Primary Examiner* — Dah-Wei D. Yuan
*Assistant Examiner* — Nga Leung V Law
(74) *Attorney, Agent, or Firm* — Ascenda Law Group, PC

(57) ABSTRACT

In a device and a method for depositing at least one layer on at least one substrate, a first gas flow comprising a reactive gas is fed through a first gas inlet opening, and a second gas flow is fed through a second gas inlet opening, into at least one gas distribution volume of a gas inlet element. The inlet element has a gas outlet surface with a multiplicity of gas outlet openings which are fluidically connected to the gas distribution volume and through which the reactive gas enters the process chamber. Products of a physical or chemical reaction of the reactive gas that have entered the process chamber form a layer on the surface of the substrate. The two gas flows are fed into the same gas distribution volume, such that zones with different concentrations of the reactive gas form within the gas distribution volume.

14 Claims, 9 Drawing Sheets

(56) References Cited

U.S. PATENT DOCUMENTS

| | | | |
|---|---|---|---|
| 6,179,920 | B1 | 1/2001 | Tarutani et al. |
| 6,756,235 | B1 | 6/2004 | Liu et al. |
| 2007/0218200 | A1 | 9/2007 | Suzuki et al. |
| 2007/0251642 | A1 | 11/2007 | Bera et al. |
| 2011/0033638 | A1 | 2/2011 | Ponnekanti et al. |
| 2012/0149212 | A1* | 6/2012 | Strauch ............... C23C 16/4412 257/E21.24 |
| 2013/0299009 | A1 | 11/2013 | Jiang et al. |
| 2015/0214044 | A1 | 7/2015 | Yanai et al. |
| 2016/0020074 | A1* | 1/2016 | Mohn ............... C23C 16/45589 239/548 |
| 2016/0111684 | A1* | 4/2016 | Savas .................... C23C 16/308 438/26 |
| 2016/0194756 | A1 | 7/2016 | Lim et al. |
| 2016/0289831 | A1 | 10/2016 | Je et al. |
| 2016/0340781 | A1 | 11/2016 | Thomas et al. |
| 2017/0101712 | A1* | 4/2017 | Bansal .............. C23C 16/45565 |
| 2017/0194172 | A1 | 7/2017 | Mudd et al. |
| 2017/0200696 | A1 | 7/2017 | Haba |
| 2017/0350688 | A1* | 12/2017 | Boyd, Jr. ............... G01B 11/14 |
| 2018/0102244 | A1 | 4/2018 | Satoh et al. |
| 2018/0135177 | A1 | 5/2018 | Lee et al. |
| 2018/0350562 | A1 | 12/2018 | Baluja et al. |
| 2019/0309419 | A1 | 10/2019 | Baluja |

FOREIGN PATENT DOCUMENTS

| | | | |
|---|---|---|---|
| EP | 0 550 058 | A2 | 7/1993 |
| EP | 0 821 084 | A1 | 1/1998 |
| EP | 1973146 | A2 | 9/2008 |
| WO | 01/04931 | A2 | 1/2001 |
| WO | 2006/020424 | A2 | 2/2006 |
| WO | 2017/200696 | A1 | 11/2017 |
| WO | 2020/231557 | A1 | 11/2020 |

OTHER PUBLICATIONS

International Preliminary Report on Patentability issued Mar. 7, 2023, from The International Bureau of WIPO, for International Patent Application No. PCT/EP2021/074235 (filed Sep. 2, 2021), 54 pgs.

International Search Report mailed Mar. 7, 2022, from the ISA/European Patent Office, for International Patent Application No. PCT/EP2021/074235 (filed Sep. 2, 2021), 14 pgs.

Written Opinion mailed Mar. 7, 2022, from the ISA/European Patent Office, for International Patent Application No. PCT/EP2021/074235 (filed Sep. 2, 2021), 28 pgs.

* cited by examiner

GAS INLET ELEMENT OF A CVD REACTOR WITH TWO INFEED POINTS

RELATED APPLICATIONS

This application is a National Stage under 35 USC 371 of and claims priority to International Application No. PCT/EP2021/074235, filed 2 Sep. 2021, which claims the priority benefit of DE Application No. 10 2020 123 076.1, filed 3 Sep. 2020.

FIELD OF THE INVENTION

The invention relates to a method for depositing at least one layer on at least one substrate, wherein a first gas flow, which includes at least one reactive gas, is fed through at least one first gas inlet opening, and at least one second gas flow is fed through at least one second gas inlet opening into at least one gas distribution volume of a gas inlet element, wherein the gas inlet element has a gas outlet surface pointing towards a process chamber, with a multiplicity of gas outlet openings, fluidically connected to the gas distribution volume, through which the reactive gas enters the process chamber, and the substrate is arranged in the process chamber in such a way that products of a physical or chemical reaction of the reactive gas that has entered the process chamber form a layer on the surface of the substrate, wherein the two gas flows are provided and fed into the same gas distribution volume in such a way that zones with a different concentration of the reactive gas are formed within the gas distribution volume.

The invention further relates to a device for depositing at least one layer on at least one substrate, with a gas inlet element, which has a gas outlet surface pointing towards a process chamber, with a multiplicity of gas outlet openings, fluidically connected to a gas distribution volume of the gas inlet element, with a susceptor, which has a support side pointing towards the process chamber for the reception of the substrate to be coated, and with a gas mixing system, which has mass flow controllers, at least one gas source for a reactive gas, and one gas source for a carrier gas, with which a first gas flow, which includes the reactive gas, can be provided and fed into a first feed line, which opens into the gas distribution volume with at least one first gas inlet opening, and with which a second gas flow can be provided and fed into a second feed line, which opens into the same gas distribution volume with second gas inlet openings.

BACKGROUND

US 2007/0218200 A1 describes a method and a device for depositing layers on a substrate, wherein a first gas flow, which includes a reactive gas, is fed into a gas distribution volume of a gas inlet element in a central region. A dilution gas is fed into the same gas distribution volume at a plurality of peripheral locations.

US 2016/0194756 A1 describes a method and a device, in which a first gas flow is fed into a gas distribution volume of a gas inlet element in a central region through a first gas inlet opening. A second gas flow can be fed into the central region through a plurality of second gas inlet openings.

Devices and methods in which a reactive gas is fed together with a carrier gas through a gas inlet element into a process chamber are also known from U.S. Pat. No. 6,756,235 B1, US 2018/0350562, US 2017/0194172, US 2018/0135177, WO 2017/0200696, US 2016/0340781, US 2016/0020074, US 2013/0299009, US 2011/0033638, US 2007/0251642, WO 2006/020424, WO 01/04931, U.S. Pat. No. 6,161,500, EP 0 821 084 and EP 0 550 058. The prior art includes CVD reactors that have a gas inlet element in the form of a shower head. One or more gas distribution volumes are located within the gas inlet element, which volumes can extend over the entire surface extent of a gas outlet surface, or only over segments or sub-sections of the gas outlet surface. A feed line opens out into the gas distribution volume, through which line a process gas, which can be a gas mixture consisting of a reactive gas and a carrier gas, or an inert gas, can be fed into the gas distribution volume. Within the gas distribution volume, the process gas is substantially uniformly distributed, in order to enter the process chamber in uniformly divided small gas flows through gas outlet openings of the gas outlet surface. Within the gas distribution volume, the process gas is homogeneously distributed. Arrangements of gas distribution volumes are known from the prior art, in which a plurality of gas distribution volumes are arranged in a concentric arrangement about a geometric center of the gas inlet element, or parallel to each other in a strip-form manner. Different process gases, and in particular also process gases, can be fed into the different gas distribution volumes, which differ only in the mixing ratio of reactive gas and carrier gas. With such an arrangement of gas distribution volumes, a concentration gradient of the reactive gas in the carrier gas can be adjusted within the process chamber. At the boundaries of the gas distribution volumes, there can be strong differences in the concentration of the reactive gas of the process gas in the process chamber.

In devices for the deposition of III-V layers, for example GaN layers or GaAlN layers or layer systems, a process gas is fed through gas outlet openings into a process chamber, in which a substrate is arranged. The substrate lies on a susceptor, which is heated. A plurality of layers can be deposited on top of each other in successive process steps. The process steps can be executed at different temperatures. In some methods there can be only a single substrate on the susceptor, which is arranged concentrically with respect to the gas outlet surface. The substrate is observed to flex due to the application of heat by the heated susceptor. Here the central region of the substrate can curve away from the gas outlet surface, or curve towards the gas outlet surface. In both cases, the distance between the substrate surface and the gas outlet surface in the central region alters. The distance in the central region differs from that in the peripheral region. As a result, the layer in the central region is deposited with a different growth rate than that in the peripheral region. Depending on the direction of the curvature, the deposited layer in the central region can be thinner or thicker than that in the peripheral region.

SUMMARY OF THE INVENTION

The invention is based on the object of specifying means with which the radial inhomogeneity of the layer thickness caused by the curvature can be counteracted. The invention is also based on the object of specifying measures with which a weak concentration gradient of the reactive gas in the process gas can be adjusted in the process chamber.

The object is achieved by means of the invention specified in the claims, wherein the subsidiary claims represent not only advantageous developments of the invention specified in the independent claims, but also stand-alone achievements of the object.

First, it is essentially proposed that first gas inlet openings open out into the gas distribution volume, by means of which a first gas flow, which includes at least one reactive gas, can be fed into the gas distribution volume, and that second gas inlet openings open out into the same gas distribution volume, by means of which a second gas flow can be fed into the gas distribution volume. In accordance with a first aspect of the invention, it is proposed that the two gas flows contain different reactive gases, or the same reactive gas in different concentrations. In accordance with a second aspect of the invention, it is proposed that the first gas inlet opening, or a plurality of first gas inlet openings, are arranged in a central region, and that the plurality of second gas inlet openings are arranged in a peripheral region. Here the first and second gas inlet openings are arranged, and the first and second gas flows are adjusted, in such a way that the gas flows emerging from the gas inlet openings have a constant concentration of the reactive gas in a carrier gas in a circumferential direction, with respect to the center of the gas outlet surface. However, in a radial direction, with respect to the center, the intention is that the concentration of the reactive gas in a carrier gas can vary. For example, with such a configuration and with such a procedure, the partial pressure of the III-component within the process chamber can be adjusted in the radial direction in such a way that, depending on the direction of the curvature of the substrate, a higher or lower partial pressure is present in the central region than in the peripheral region, so that the growth rate in the central region can be greater or smaller than that in the peripheral region. It is therefore proposed that at least two gas inlet openings are envisaged in the gas distribution volume, through which gases, or gas mixtures with a different composition, are fed into the gas volume. This takes place in such a way that the gases do not mix homogeneously within the gas distribution volume, but in such a way that zones are formed with a different concentration of the at least one reactive gas within the gas distribution volume. As a consequence, in the zones with a different concentration of the reactive gas, gas flows with different concentrations of the reactive gas enter the process chamber through the gas outlet openings assigned to these zones. Between the two gas inlet openings, there are preferably no partition walls, flow barriers, or regions of reduced cross-section, or the like, so that a weak concentration gradient can form between the zones within the gas distribution volume. Nevertheless, it can be envisaged that a restrictor plate extends within the gas distribution volume, which can take the form, for example, of a perforated plate or a frit, which consists of a porous, gas-permeable material. A planar concentration gradient is formed in the process chamber. In a preferred configuration of the invention, it is proposed that the other gas includes a second reactive gas. The second reactive gas can be identical to the first reactive gas, or can have a different element of the same main group. It can also differ in other respects from the first reactive gas. It can furthermore be envisaged that the other gas is only the carrier gas, or an inert gas. However, the variant is preferred in which the same reactive gas, but in a different dilution, is fed in the carrier gas into the gas distribution volume through the two gas inlet openings. The invention therefore relates to a device and a method in which the same reactive gas is fed into the same gas distribution volume at two mutually different points, but in each case with a different mixing ratio of the reactive gas to the carrier gas, so that a concentration gradient is formed within the gas distribution volume. It can furthermore be envisaged that the gas distribution volume has a geometric center, and that the one, or plurality of, first gas inlet openings are arranged at the geometric center, or about the latter. One or more of the second gas inlet openings can be arranged at a location remote from the geometric center. One or more of the gas distribution elements can be arranged within the gas distribution volume. The first gas flow can be fed into the gas distribution volume at a first infeed point. The gas inlet opening can form the infeed point. However, the gas distribution element, which is formed by a multiplicity of gas inlet openings, can also communicate with the infeed point. Around the first infeed point one or more additional gas distribution elements can be arranged, with which the second gas flow can be fed into the gas distribution volume. The second gas flow is fed into the gas distribution element at a second infeed point. It enters the gas distribution volume through gas inlet openings formed by the gas distribution element. These openings can extend about the geometric center in an annular arrangement. However, a plurality of further infeed points can also be envisaged, which are arranged in a uniform circumferential distribution about the geometric center at a uniform distance from the geometric center, wherein a direct feed of the further gas into the gas distribution volume can take place at the further infeed points. However, the gas can also be fed into a gas distribution element, which distributes the additional gas in a planar or linear manner in the gas distribution volume. A local feed of the process gas can also take place at the first infeed point. Here it can also be possible that the feed takes place into a gas distribution element arranged there, which distributes the first process gas over a large area in the region of the center of the gas distribution volume. In particular, it is envisaged that the gas distribution elements are arranged in such a way that a radial concentration gradient of the reactive gas is established within a gas distribution volume, wherein it is also possible to envisage that an azimuthal concentration gradient disappears. The device in accordance with the invention, or the method in accordance with the invention, is particularly suitable for the deposition of IV-IV layers, III-V layers, or II-VI layers, on large-area substrates. Substrates are preferably used that have a surface that is only slightly smaller than the gas outlet surface. The gas outlet surface preferably extends at least over the entire surface of the substrate. The cross-sectional surface of the gas distribution volume can extend over the entire gas outlet surface. In accordance with one variant of the invention, two or a plurality of gas distribution volumes each extend over sub-regions of the gas outlet surface. Here, too, it can be envisaged that each of the one, or plurality of, gas distribution volumes has a first, and at least one other, infeed point, at which gas mixtures of different compositions can be fed in. In the prior art, gas inlet devices are described, in which a plurality of gas distribution volumes run next to each other in a strip-form manner. Different compositions of process gases can be fed into these gas distribution volumes, which run parallel to one another, at different infeed points, in order to produce the above-described effect within the process chamber. For example, a central, narrow gas distribution volume passes through, or approximately through, the geometric center of the gas inlet element. A first infeed point can be provided in the center of this central gas distribution volume, and a second infeed point can be provided at each of the two ends of the gas distribution volume. The two infeed points can each form gas inlet openings. However, it can also be envisaged that gas distribution elements with gas inlet openings are provided at the infeed points. In addition to these central gas distribution volumes, further similarly configured, narrow gas distribution volumes extend to the edge of the gas inlet element. Each of these gas distribution volumes can have a central infeed point, and a second infeed point at each of the two ends. Reactive gases with different compositions or concentrations in a carrier gas can be fed in through the two second infeed points, which are preferably arranged at the edge of the gas inlet element. The invention can also be implemented on such gas inlet elements in which a plurality of gas sub-volumes are arranged in a concentric arrangement. In accordance with the invention, the infeed points, or the gas distribution elements fluidically connected thereto, are arranged in such a way that the gas flows emerging from the gas outlet openings of the gas outlet surface have different concentrations of the reactive gas in the radial direction, with respect to a center of the gas outlet surface. The infeed points, or the gas distribution elements assigned to them, can furthermore be arranged in such a way that the gas flows emerging from the gas outlet openings have constant concentrations of the reactive gas in an azimuthal direction, with respect to a center of the gas outlet surface. However, it can also be envisaged that a plurality of infeed points, or gas distribution elements, fluidically connected with feed lines opening at the infeed points, are arranged in such a way that the gas flows emerging from the gas outlet openings have different concentrations of the reactive gas within the surface extent of the gas outlet surface. For this purpose, it proves to be advantageous if the reactive gases are provided by a common gas source. The reactive gas is fed from a gas mixing system to a CVD reactor by way of a feed line. The feed line can be branched. At the first infeed point, a first branch can open out into the gas distribution volume or a gas distribution element. At the second infeed point, a second branch opens out into the gas distribution volume, or into a gas distribution element. An additional carrier gas flow can be fed into the second branch by means of a mass flow controller, so that the process gas fed by way of the second branch is diluted compared to the process gas fed by way of the first branch. However, it is also possible to dilute the process gas flow fed by way of the first branch. However, the diluted gas is preferably fed into an annular zone spaced apart from the center. The annular zone can comprise an annular or horseshoe-shaped gas distribution element. A plurality of annular zones arranged concentrically with respect to each other can be envisaged, into each of which diluted reactive gases, for example, are fed by means of a gas distribution element, or by means of feed lines opening out there. An electronic control device can be envisaged, with which valves and mass flow controllers are controlled. The control device can be programmable, and can also control a heating device or a vacuum pump. In one development of the invention, it can be envisaged that a gas mixing system provides process gases for two reactors. A mass flow controller can be envisaged, with which a mass flow of the reactive gas is provided. A further mass flow controller can be used to mix a carrier gas with the mass flow of the reactive gas. This gas flow can either be fed into only one gas distribution volume at a first infeed point, or divided into two gas flows at infeed points of a plurality of, in particular two, gas distribution volumes, wherein the gas distribution volumes belong to mutually different reactors. In a corresponding manner, the gas mixing system also delivers a small further carrier gas flow, which is fed into further branches of the process gas feed line, which open out at further infeed points, so as there to feed a diluted process gas into the gas distribution volume. The dilution is preferably about 1 to 10%, or 2 to 10%.

In one variant of the invention, the gas distribution volume can be divided into an upper section and a lower section. The division is made by means of the above-mentioned restrictor plate, which is permeable to gas, wherein the passage of gas through the restrictor plate requires, however, a small pressure difference between the upper section and the lower section. In accordance with one variant of the invention, it can be envisaged that all gas inlet openings, or all gas distribution elements, are arranged in the upper section. In this variant, the same reactive gas, but in a different concentration, is fed in a carrier gas into the upper section through the gas inlet openings or gas distribution elements, arranged at different radial distances from a central gas inlet opening or from a central gas distribution element. Here this is preferably a reactive gas of an element of the III$^{rd}$ main group. A gas of an element of the V$^{th}$ main group can be fed into another gas distribution volume. In accordance with a further variant, the reactive gas is fed only through a central gas inlet opening, or through gas inlet openings of a central gas distribution element, in particular together with a carrier gas. Only the carrier gas is fed through further gas distribution elements arranged about the central gas inlet opening, or about the central gas distribution element, in order to dilute the reactive gas in the gas distribution volume. In this variant, the central gas inlet opening, or the central gas distribution element, is arranged in the upper section. The other gas inlet openings, or gas distribution elements, with which only the carrier gas, which is an inert gas, is fed in, are arranged in the lower section.

In a further variant, it can be envisaged that a directed gas flow flows from the gas inlet openings into the gas distribution volume. Here, the gas flow has a directional component that is parallel to the direction in which the gas outlet surface extends. The gas distribution volume can have an upper wall. The directional component of the gas flow can run parallel to the direction in which the upper wall extends. In overall terms the gas flow can run parallel to the direction in which the upper wall extends. In a further variant, it can be envisaged that the gas flow emerging from the gas inlet openings has a directional component in a direction onto the upper wall. The gas flow can be directed obliquely towards the upper wall. It can therefore have a directional component in a direction away from the gas outlet surface, and at the same time a directional component in the direction in which the gas outlet surface extends. The gas inlet openings are preferably arranged in a regular arrangement in a circumferential zone about a geometric center of the gas outlet surface.

BRIEF DESCRIPTION OF THE DRAWINGS

Example embodiments of the invention are explained below by means of the accompanying figures. Here.

DETAILED DESCRIPTION

Figure 1:
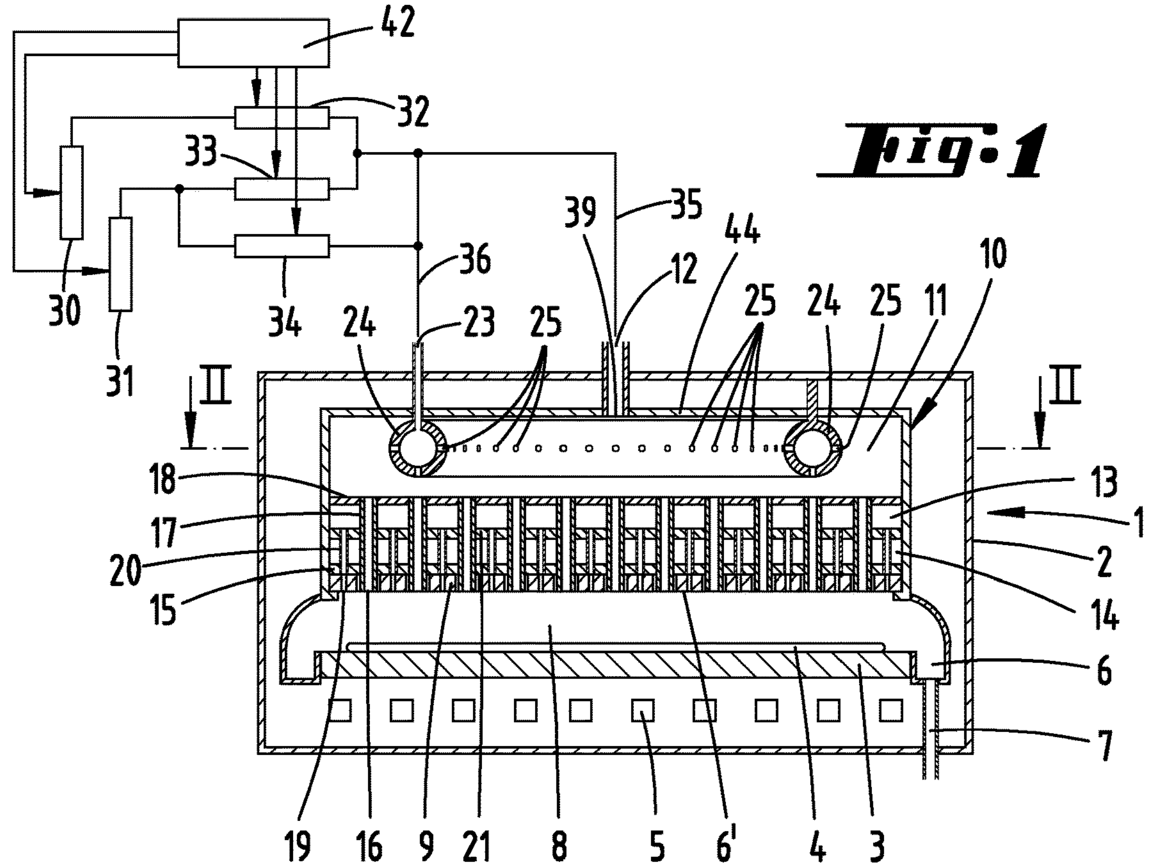
FIG. 1 shows a first example embodiment of the invention by means of a schematic longitudinal section through a CVD reactor 1.

The example embodiments relate to an arrangement, each with at least one CVD reactor 1, which is supplied with process gases by a gas mixing system and to which is assigned a gas disposal system (not shown in the figures), which can have a pump and a gas cleaning device. The CVD reactor 1 has an externally gas-tight housing with a housing wall 2, which surrounds a cavity. Within the evacuable cavity of the reactor housing 1 is located a susceptor 3 made of graphite, which on its upwardly pointing side carries one or more substrates 4 that are to be coated. Below the susceptor 3, which is in the form of a circular disc, is a heating device 5, with which the susceptor 3 can be heated up to process temperatures between 500 and more than 1000° C.

A process chamber 8 extends above the susceptor 3, into which a process gas is fed. The latter takes place through a gas outlet surface 6' that forms, as it were, the ceiling of the process chamber 8, which in the example embodiment is implemented in terms of a shield plate 9. Instead of the shield plate, however, a diffusion plate can also be arranged there. However, it is also possible that the gas outlet surface 6' is formed directly in terms of a base plate of a gas inlet element 10.

The gas inlet element 10, which in the example embodiments extends directly above the shield plate 9, is formed by a hollow body, which has at least one gas distribution volume 11. In the example embodiment, the gas inlet element 10 has a further gas distribution volume 13, which extends below the gas distribution volume 11. A coolant chamber 14, through which a coolant flows, adjoins the base plate of the gas inlet element 10. Each of the two chambers forming a gas distribution volume 11, 13 is fluidically connected to the gas outlet surface 6' by means of tubes 17, 20, so that process gases fed into the gas distribution volumes 11, 13 can emerge from the gas outlet surface 6' in a uniform flow distribution. The process gases enter the process chamber 8, and flow through the process chamber 8 in a radial direction towards a gas outlet element 6, which annularly surrounds the process chamber 8 and is connected to the gas disposal system by means of a gas outlet 7. Different reactive gases, in each case together with a carrier gas, can be fed into the two gas distribution volumes 11, 13, which are only illustrated schematically in the figures. The reactive gases pass through the tubes 17, 20 into the process chamber 8, where they decompose or react with each other, so that a layer consisting of reaction products of the reactive gases is deposited on the surface of the substrate.

A reactive gas containing an element of the III$^{rd}$ main group, together with an inert gas, for example hydrogen, can be fed into the gas distribution volume 11. The inert gas forms a carrier gas. A reactive gas comprising an element of the V$^{th}$ main group, together with an inert gas, for example hydrogen, can be fed into the gas distribution volume 13. In the gas phase above the substrate 4, or on the surface of the substrate 4, a chemical reaction of the two reactive gases can take place in such a way that a layer consisting of the elements of the III$^{rd}$ and V$^{th}$ main groups is deposited on the surface of the substrate 4. Here the growth rate is determined by the partial pressure of the reactive gas of the III$^{rd}$ main group, which can be an organometallic compound, at the substrate surface, or by the mass flow of the reactive gas of the III$^{rd}$ main group from the gas outlet surface.

The invention is explained in more detail below with respect to the gas distribution volume 11:

The gas distribution volume 11 extends over the entire circular gas outlet surface 6' in the first to fourth, and ninth to eleventh, example embodiments shown in FIGS. 1 to 8, and 15 to 17, respectively. The gas outlet openings 16, and the tubes 17, 20 corresponding to them, are evenly distributed over the entire gas outlet surface 6'. Feed lines 35, 36, 38 open out into the gas distribution volume 11 at at least two different infeed points 12, 23, 26, by means of which a process gas can be fed into the gas distribution volume 11 at different points in each case. Here the process gas enters the gas distribution volume 11 through gas inlet openings 25, 28, 39. In the example embodiment described in FIGS. 1 to 8, the gas distribution volume has a constant height over its entire surface extent, and has no partition walls or other elements inhibiting gas propagation within the gas distribution volume 11. In the example embodiments illustrated in FIGS. 15 to 17, partition walls, or diffusion or flow barriers 40, are provided to slow down a migration of molecules from one zone to another zone of the gas distribution volume 11. It is also envisaged that each of the various infeed points 12, 23, 26 is assigned to a zone that is fluidically connected with the other zones.

A mixture of a reactive gas with a carrier gas is fed in at each of the different infeed points 12, 23, 26, wherein the mixing ratios between the respective reactive gas and a carrier gas, or inert gas, are different at the infeed points 12, 23, 26.

The mixing ratios are adjusted with a gas mixing system. The gas mixing system has a gas source 30 for a reactive gas, and a gas source 31 for a carrier gas, or an inert gas. The reactive gas can take the form of an organometallic compound of an element of the II$^{nd}$, III$^{rd}$, or IV$^{th}$ main group. It can also take the form of a hydride of an element of the IV$^{th}$, V$^{th}$, or VI$^{th}$ main group. Preferably, it takes the form of a mixture of such gases. The inert gas can be hydrogen, nitrogen, or a noble gas. A mass flow of the reactive gas is provided by a mass flow controller 32, and is diluted by means of the carrier gas and a mass flow controller 33. The mass flow of a process gas thus provided is split into a feed line 35, which opens out into the gas distribution volume 11 at a central gas inlet point 12, and into a feed line 36, which opens out into the gas distribution volume 11 at a peripheral gas inlet point 23. A carrier gas flow is fed into the feed line 36 by means of a mass flow controller 34, so that the process gas fed in at the peripheral gas inlet point 23 is diluted compared to the process gas fed in at the central gas inlet point 12.

Figure 2:
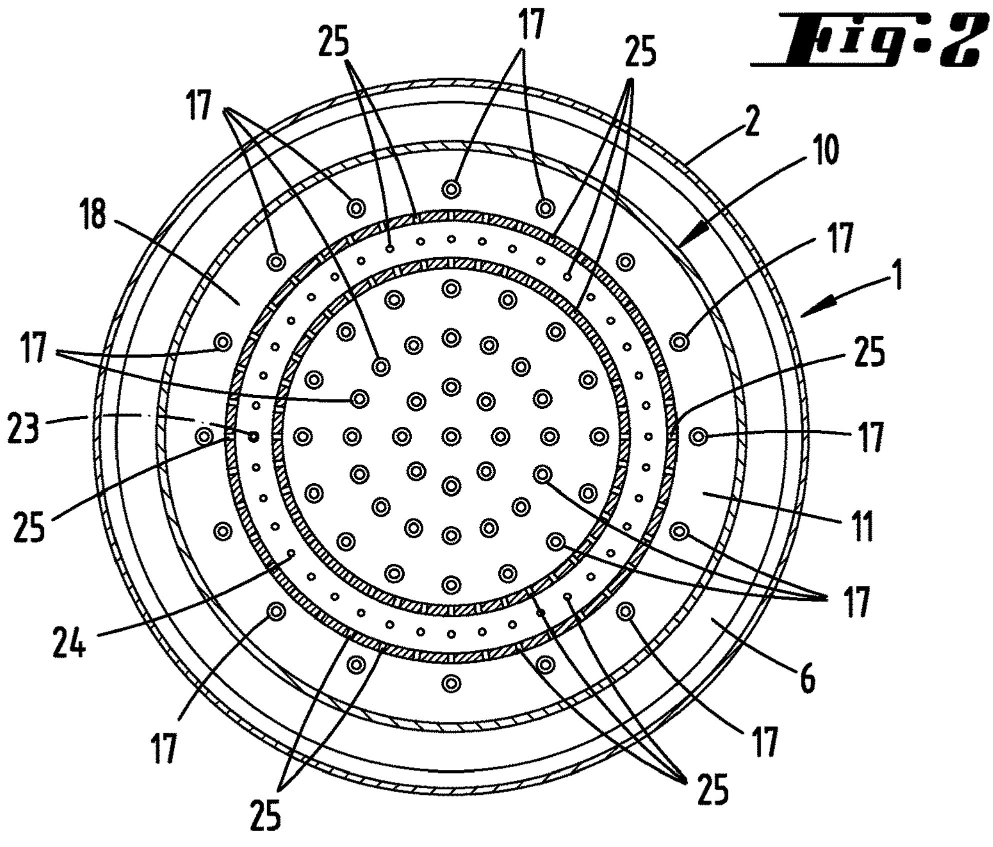
FIG. 2 shows a cross-section along the line II-II in FIG. 1.

In the example embodiment illustrated in FIGS. 1 and 2, a gas distribution element 24 extends within the gas distribution volume 11, which element has an annular configuration, and can be formed as a pipe bent into a ring. Gas inlet openings 25 are located in the wall of the gas distribution element 24, which openings feed the process gas fed into the peripheral gas inlet point 23 into an annular zone about the geometric center of the gas distribution volume 11.

At the gas inlet point 12, a single pipe can open out into the gas distribution volume 11, as illustrated in FIG. 1. Here the gas inlet point 12 is designed as a gas inlet opening 39. However, it is also possible for a plurality of pipes to open out into the gas distribution volume 11 in the center of the gas distribution volume 11. A first gas flow of a mixture of the carrier gas and the reactive gas can flow into the gas distribution volume 11 through one or more gas inlet openings 39. Furthermore, it can be envisaged that an annular opening, or a concentric ring of gas inlet openings, is arranged at the central gas inlet point.

A second gas flow of a mixture of the carrier gas and the reactive gas enters into the gas distribution volume 11 through the gas inlet openings 25. However, the mixing ratio here differs from that of the first gas flow.

The gas outlet openings 16 can be located at the corner points of a grid, wherein the grid cell can be rectangular, square, hexagonal or polygonal. The gas outlet openings 16 are preferably located at the corner points of a grid that is made up from identical grid cells. However, the gas outlet openings 16 can also be arranged on concentric lines about the center of the gas outlet surface.

Figure 3:
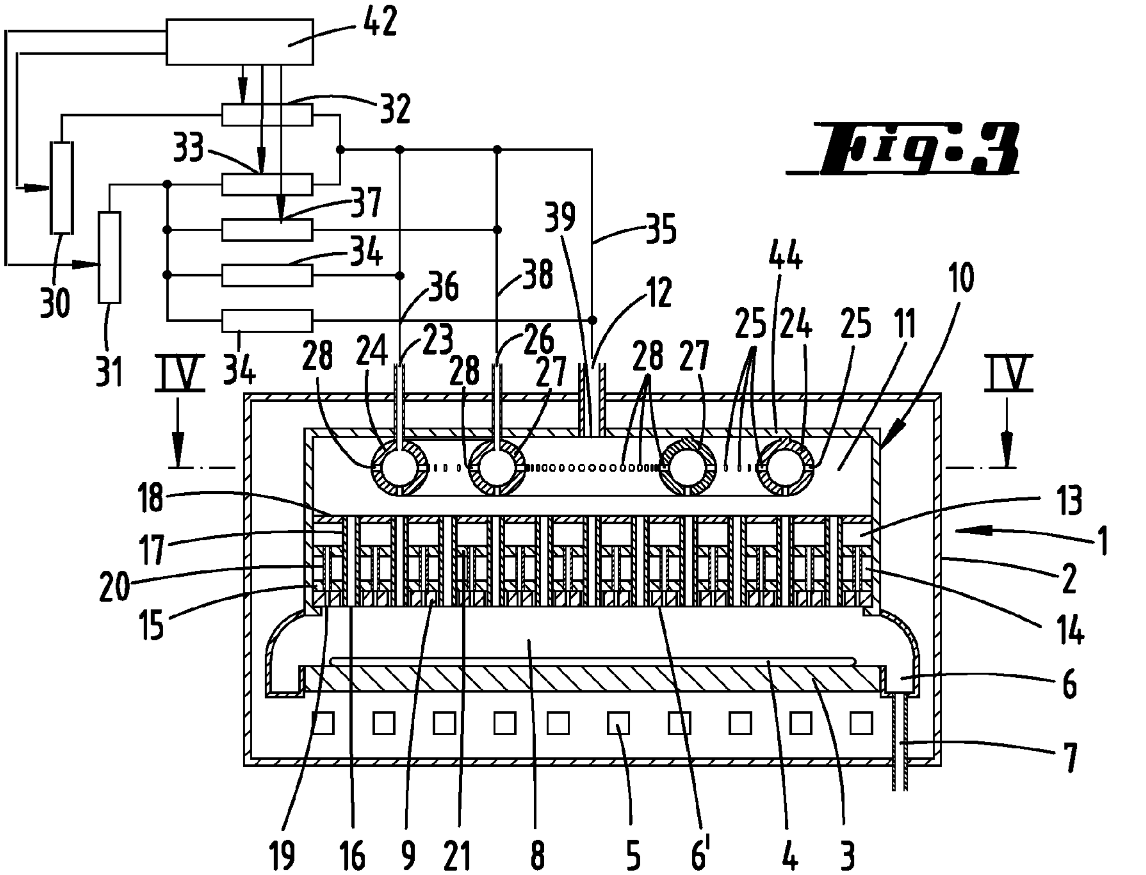
FIG. 3 shows an illustration in accordance with FIG. 1 of a second example embodiment.
Figure 4:
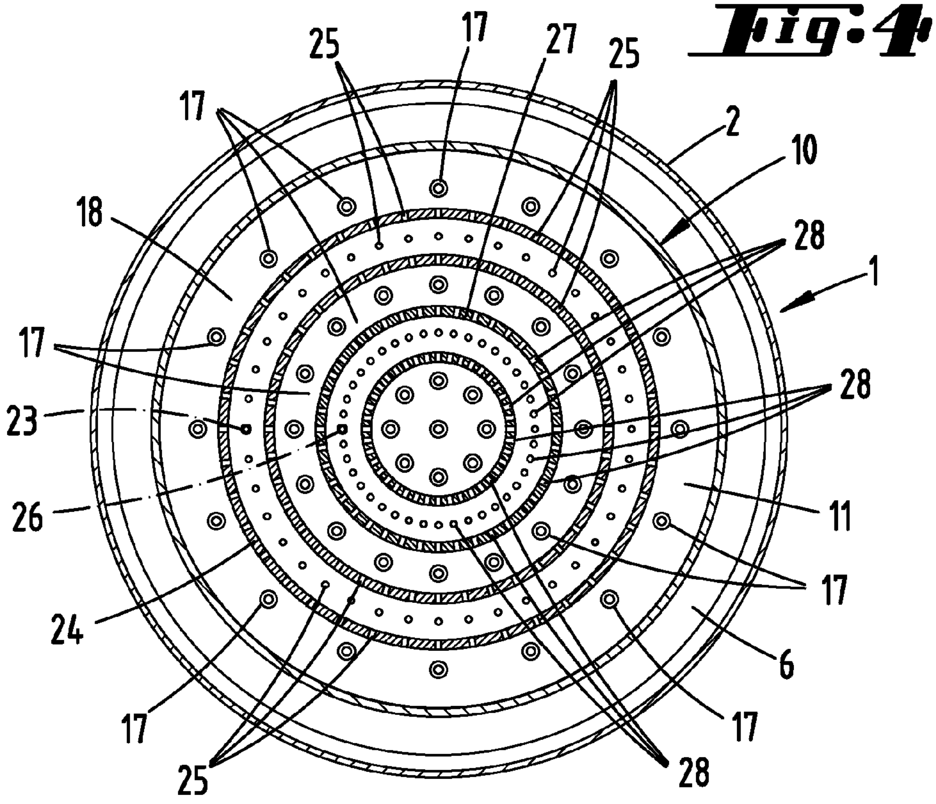
FIG. 4 shows a cross-section along the line IV-IV in FIG. 3.

The second example embodiment illustrated in FIGS. 3 and 4 differs from the first example embodiment essentially in that a radially inner gas distribution element 27 is arranged between a radially outer gas distribution element 24, which also has an annular configuration. The two gas distribution elements 24, 27 are arranged concentrically with respect to the central gas inlet point 12. A feed line 38 opens out at the gas inlet point 26, through which line a process gas, diluted by the carrier gas by means of a mass flow controller 37, is fed in. By means of the mass flow controllers 34, 37, the degree of dilution of the process gas can be adjusted so that a radial concentration gradient is adjusted within the gas distribution volume 11, which results in a process gas with a higher concentration of the reactive gas being fed into the process chamber 8 through the gas outlet openings 16 arranged in the center of the gas outlet surface 6' than that fed in through the peripheral gas outlet openings 16.

In one example embodiment (not shown), more than two annular zones can be envisaged within the gas distribution volume 11, where in each case a gas distribution element, extending in the region of the said zone, is provided.

The gas inlet openings 25 and 28, of the gas distribution elements 24 and 27 respectively, can extend in a direction transverse to the plane in which the gas distribution element 24, 27 extends. The gas inlet openings 25 and 28 can be lateral openings. However, the gas inlet openings 25, 27 can also open out in the direction onto the gas outlet surface 6'. The gas inlet openings 25 and 28 can thus also be openings pointing downwards. However, the gas inlet openings 25, 28 can be directed upwards, and can thus have a directional component that is directed away from the gas outlet surface 6'.

Figure 5:
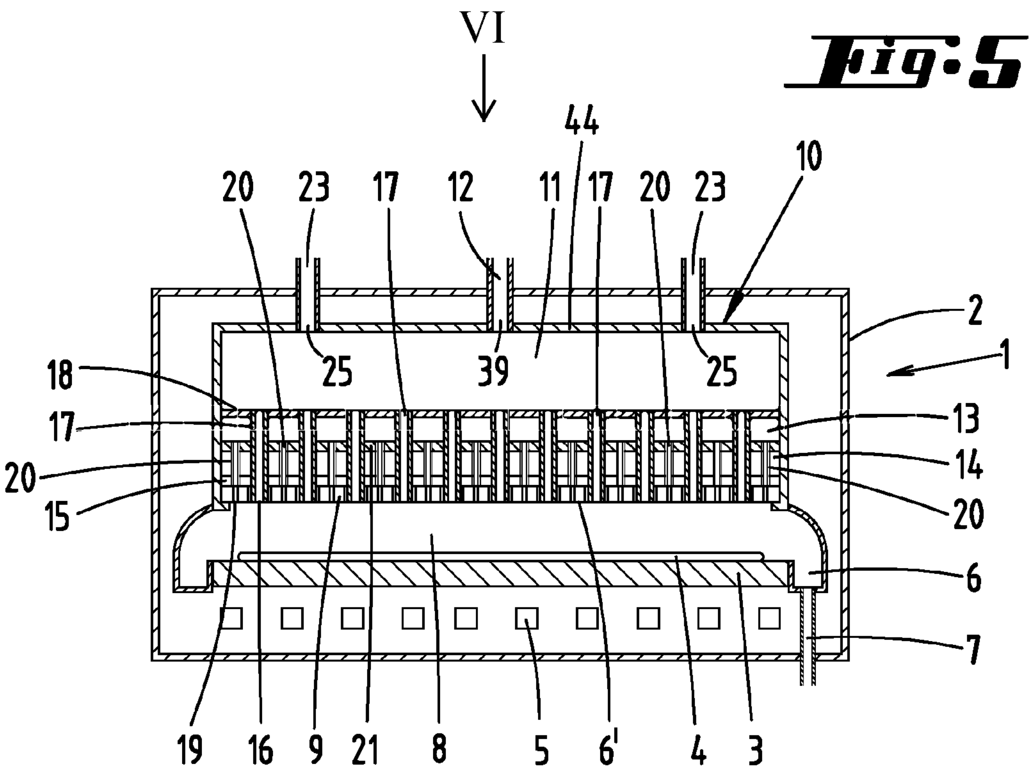
FIG. 5 shows an illustration in accordance with FIG. 1 of a third example embodiment.
Figure 6:
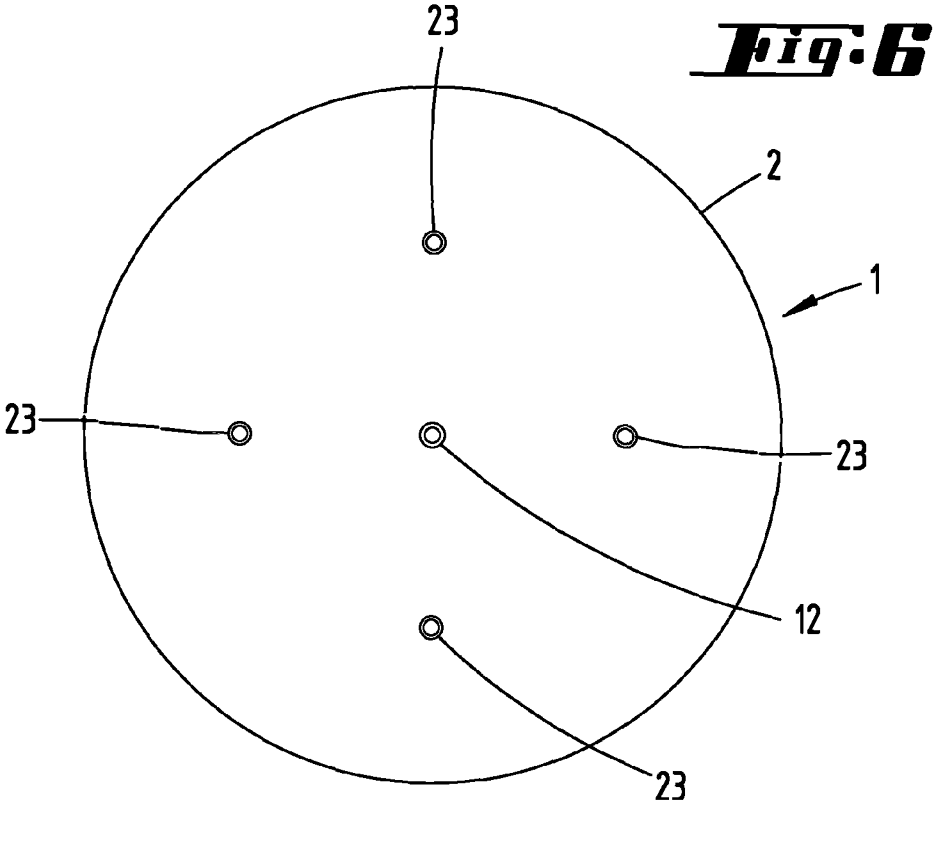
FIG. 6 shows a plan view in accordance with arrow VI in FIG. 5.

In the example embodiment illustrated in FIGS. 5 and 6, a central gas inlet is envisaged at a central infeed point 12 arranged in the geometric center of the gas distribution volume 11, which has a circular outline. A plurality of further infeed points 23 are envisaged, arranged in a uniform circumferential distribution about the geometric center. Process gases with a different mixture can be fed directly into the gas distribution volume at the infeed point 12 and the peripheral infeed points 23.

Figure 7:
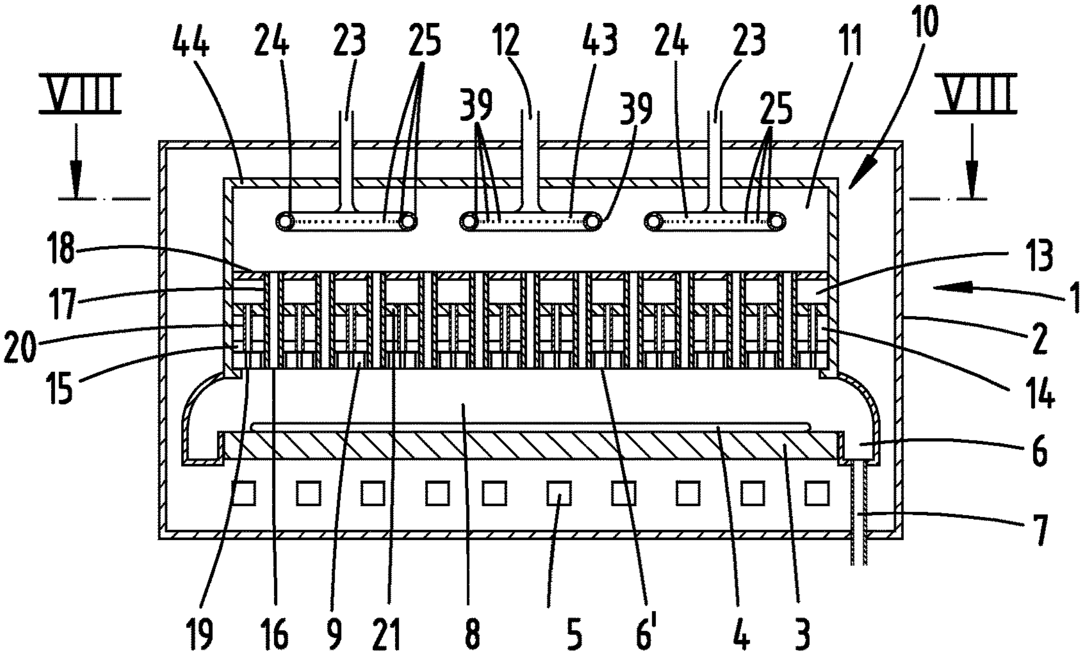
FIG. 7 shows an illustration in accordance with FIG. 1 of a fourth example embodiment.
Figure 8:
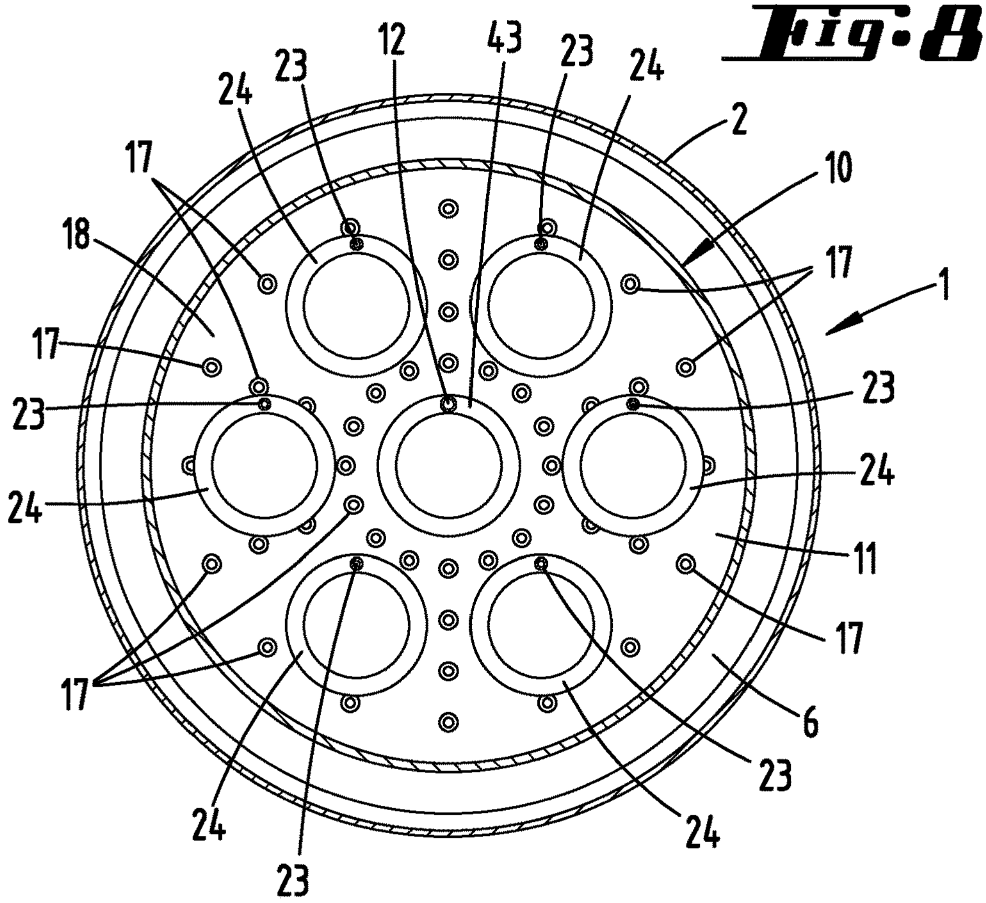
FIG. 8 shows the cross-section along the line VIII-VIII in FIG. 7.

In the example embodiment illustrated in FIGS. 7 and 8, a central gas distribution element 43 is arranged in the geometric center of the gas distribution volume 11. It takes the form of a pipe bent into a ring, with gas inlet openings 39 arranged in the pipe wall, which pipe is fed by a feed line (not shown), which opens out into the central gas distribution element 43 at an infeed point 12. Around the central gas distribution element 43, a plurality of gas distribution elements 24 are arranged in a uniform circumferential distribution, which in the example embodiment are also formed by a pipe bent into a ring, which has openings 25 in the pipe wall. The same process gas, that is to say, the same mixture of a reactive gas with a carrier gas, can be fed into the plurality of peripheral gas distribution elements 24. However, it is also envisaged that different mixtures of a reactive gas with a carrier gas are fed into the mutually different gas distribution elements 24 at the respective infeed points 23.

A gas distribution element 24 is arranged at each infeed point 23, which element is designed as an annular pipe. These are peripheral gas distribution elements 24 that extend in a circumferential zone about a central gas distribution element 43 with gas inlet openings 39.

Figure 9:
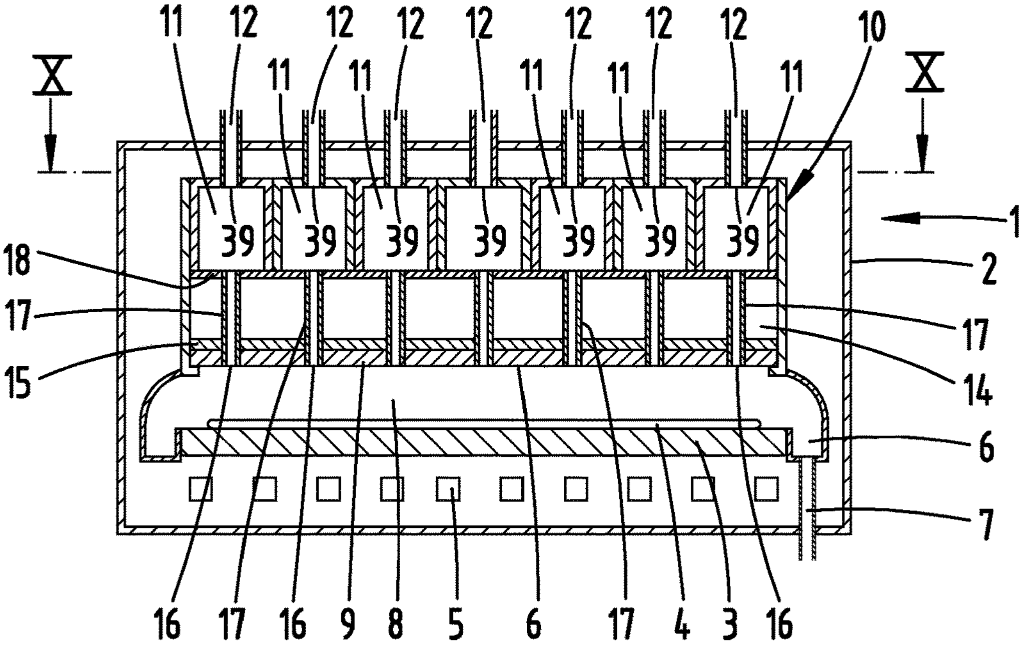
FIG. 9 shows an illustration in accordance with FIG. 1 of a fifth example embodiment.
Figure 10:
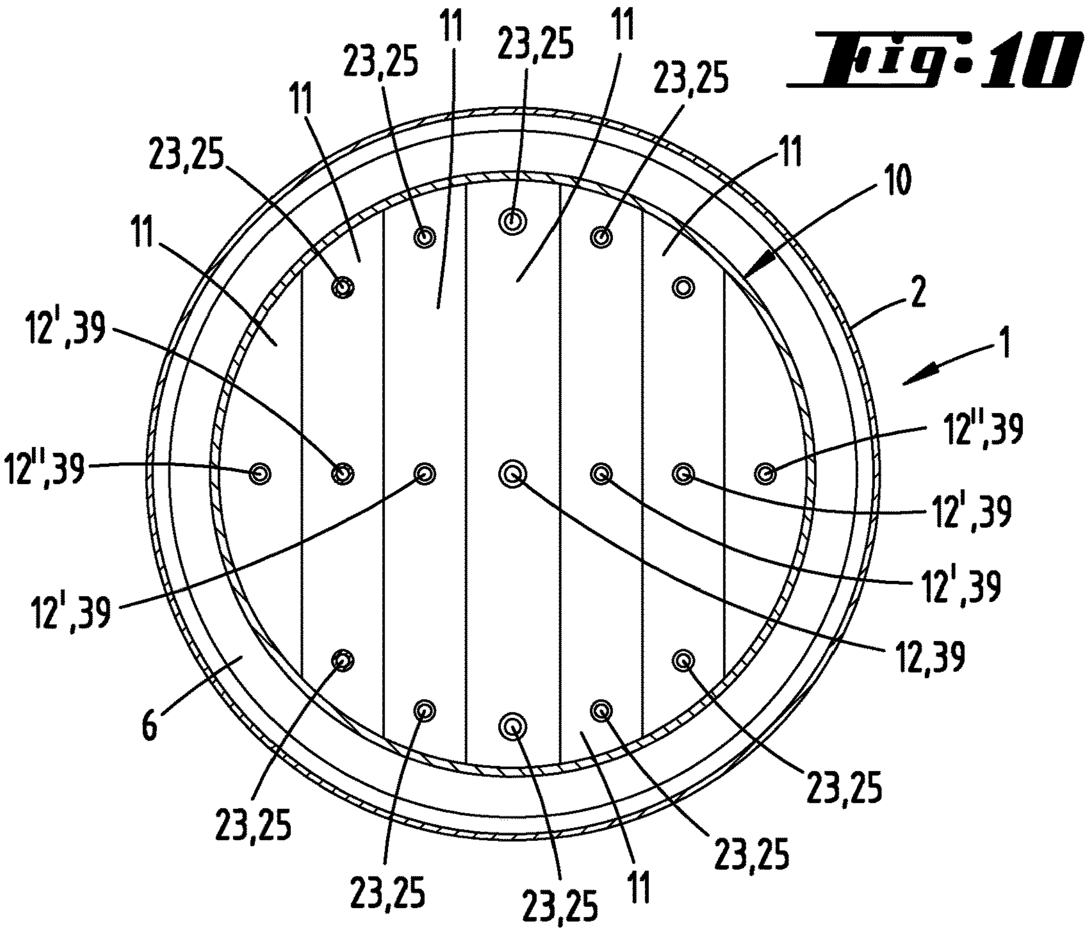
FIG. 10 shows the cross-section along the line X-X in FIG. 9.

In the example embodiment illustrated in FIGS. 9 and 10, the gas inlet element 10 has a multiplicity of gas distribution volumes 11 arranged in a strip-form manner. A central gas distribution volume 11 extends diametrically through the center of the circular gas inlet element 10. Further gas distribution volumes 11 adjoin each of the two longitudinal sides of the narrow gas distribution volume 11. A plurality of narrow gas distribution volumes 11, extending over the entire gas outlet surface 6', lie adjacent to each other.

Each gas distribution volume 11 has at its center a first infeed point 12, 12', at which a process gas can be fed into the respective gas distribution volume. With the exception of an outer gas distribution volume 11, each gas distribution volume 11 also has at its two ends, which lie at the edge of the gas outlet surface 6', further infeed points 23, at which a process gas with a different mixture can be fed in.

The central infeed point 12 corresponds to a gas inlet opening 39 for feeding in the first gas flow. The infeed points 23 each correspond to gas inlet openings 25 for feeding in the second gas flow. The central infeed points 12, 12', 12" can be fed from a common feed line. The infeed points 23 can also be fed from a common feed line.

Figure 11:
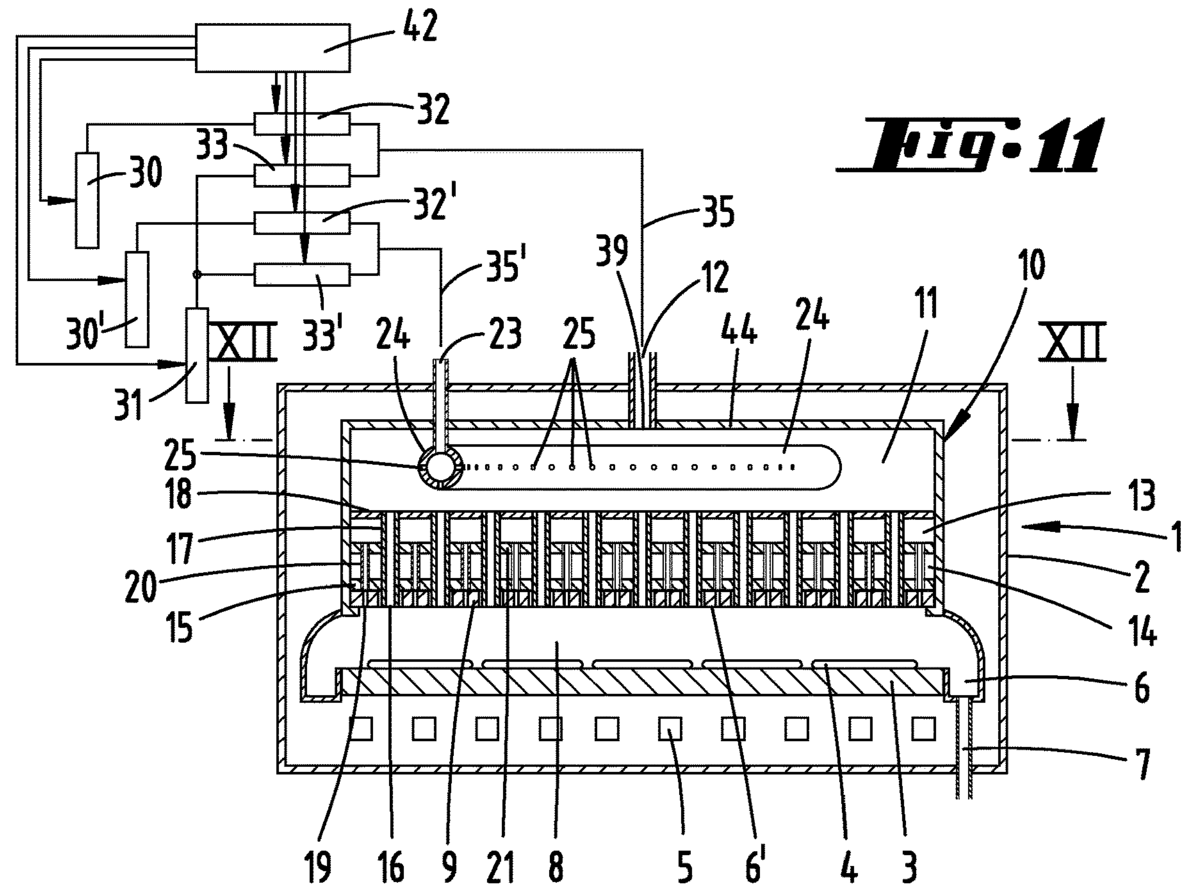
FIG. 11 shows an illustration in accordance with FIG. 1 of a sixth example embodiment.

While, in the previously described example embodiments, a susceptor 3 carries a single, large-area substrate 4, in further example embodiments (not shown), which in other respects correspond to the above-described example embodiments, a multiplicity of substrates 4 can be arranged on the susceptor 3, as is illustrated in FIG. 11.

Figure 12:
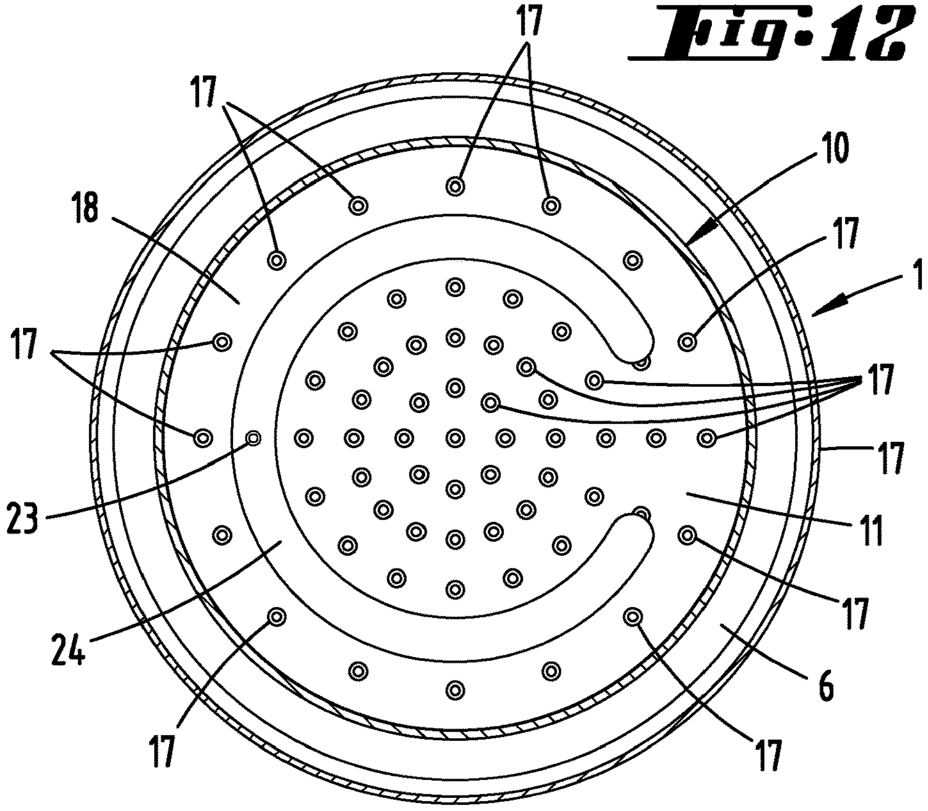
FIG. 12 shows the cross-section along the line XII-XII in FIG. 11.

The example embodiment illustrated in FIGS. 11 and 12 differs from the above-described example embodiments essentially in the form of the gas distribution element 24, which here is designed in the shape of a horseshoe. Here too it is possible for a plurality of gas distribution elements 24 to be arranged concentrically with the geometric center of the gas distribution volume 11.

In this example embodiment, different process gases can be fed into the two infeed points 12 and 23. Additional mass flow controllers 32', 33' are provided for this purpose, with which a mixture is generated of a reactive gas provided by a gas source 30' with the carrier gas provided by the gas source 31. With a feed line 35', this process gas mixture is fed into the gas distribution element 24 at the infeed point 23. The gas distribution element 24 has a multiplicity of uniformly arranged gas inlet openings 25, which are directed both to the side and also downwards.

The figures also show a control device 42 with which the mass flow controllers 32, 37, 34, but also the gas sources 30, 31, or a heating device 5, can be controlled. With the control device 42, the gas flows can be controlled in such a way that the concentration of the reactive gas in the process chamber, as described above and in what follows, is achieved.

Figure 13:
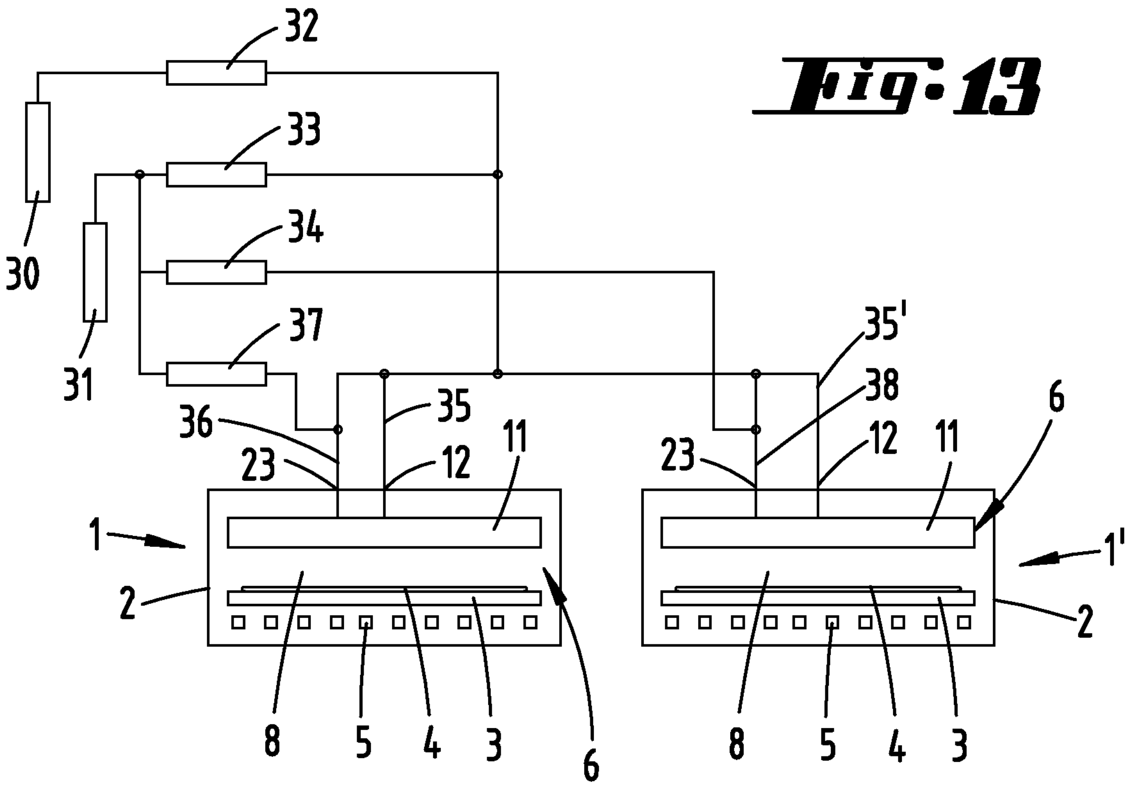
FIG. 13 shows a schematic illustration of a seventh example embodiment.

The example embodiment illustrated in FIG. 13 shows a modified gas mixing system, in which a mixture of a reactive gas and a carrier gas is generated by means of the mass flow controllers 32, 33. The mixture is fed into a feed line that branches a number of times. The feed line first branches into a feed line 35, which at a infeed point 12 opens out into a gas distribution volume 11 of a first CVD reactor 1, and also branches into a feed line 35', which opens out into a gas volume 11 of a second CVD reactor 1'.

Two mass flow controllers 34, 37 are envisaged, each of which provides a carrier gas, which is fed into a feed line 36 and 38, respectively, in order to dilute the process gas there. The feed lines 36 and 38 open out into the gas distribution volume 11 at a infeed point 23. The CVD reactors 1, 1' can be designed as illustrated in FIGS. 1 to 11.

Figure 14:
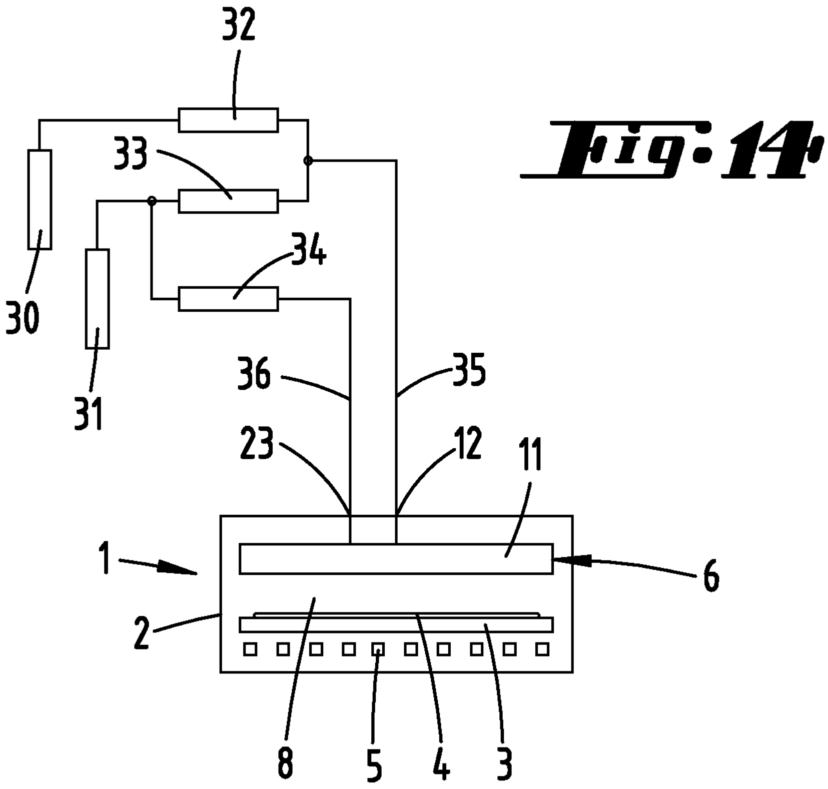
FIG. 14 shows schematically an eighth example embodiment.

The example embodiment illustrated in FIG. 14 shows another modified gas mixing system, in which only a carrier gas is fed into the gas distribution volume 11 at the peripheral infeed point 23.

Figure 15:
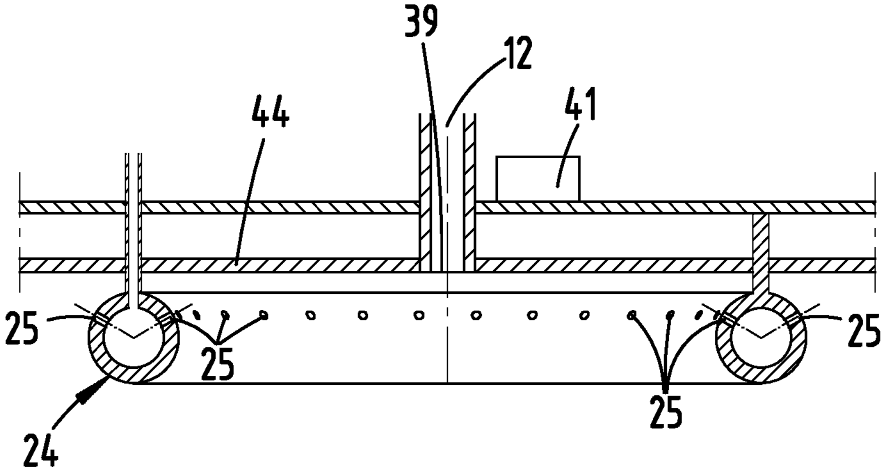
FIG. 15 shows, in an illustration in accordance with FIG. 1, a ninth example embodiment.

FIG. 15 shows an example embodiment that differs from the example embodiment shown in FIG. 1 essentially in that the gas inlet openings 25 are oriented obliquely in the direction of an upper wall 44 of the gas distribution volume 11. In addition, FIG. 15 shows a measuring device 41, for example an optical measuring device, with which the deflection of a substrate 4 can be determined; the measuring device can deliver measured values to the control device 42. Depending on the degree of deflection, the control device 42 can be used to vary the mixing ratios of reactive gas and carrier gas in the gas flows to the individual infeed points 12, 23. It is therefore envisaged that during a deposition process, the mixing ratios of the gas flows are varied by the control device 42, wherein the variations can depend on the measured deflection of the substrate 4. However, the mixing ratios can also depend on the nature of the particular process step. The deflection can be up to 0.5 to 1 mm.

Figure 16:
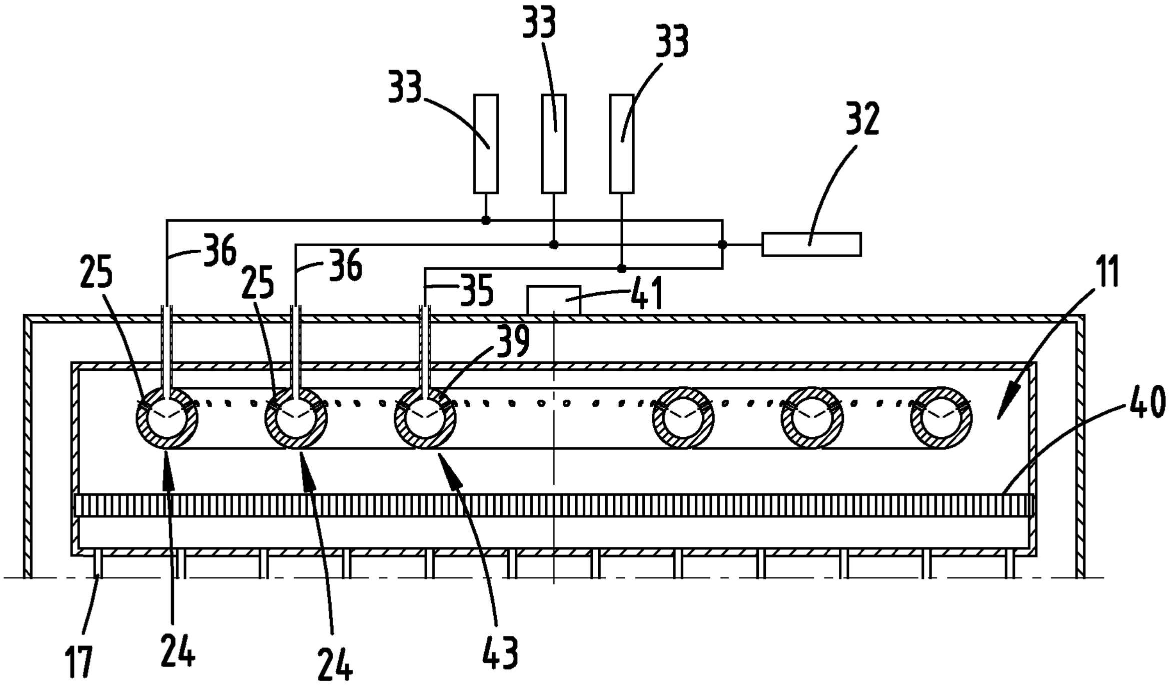
FIG. 16 shows, in an illustration in accordance with FIG. 1, a tenth example embodiment.

FIG. 16 shows another variant, in which a plurality of annular gas distribution elements 24 are arranged about a central annular gas distribution element 43. The first gas flow can be fed through the gas inlet openings 39 of the central annular gas distribution element 43, and one, or a plurality of, second gas flows can be fed through the gas inlet openings 25 of the peripheral gas distribution elements 24 into an upper section of the gas distribution volume 11. The upper section is separated from a lower section by a restrictor plate 40. The lower section is fluidically connected to the gas outlet surface 6' by means of the tubes 17. In the example embodiment illustrated in FIG. 16, all gas distribution elements 24, 43 are located in the upper section. A mixture of a reactive gas with an inert gas is fed through each of the gas distribution elements 24, 43, wherein, however, the mixing ratios differ. The gas distribution elements 24, 43 can lie in a common plane.

Figure 17:
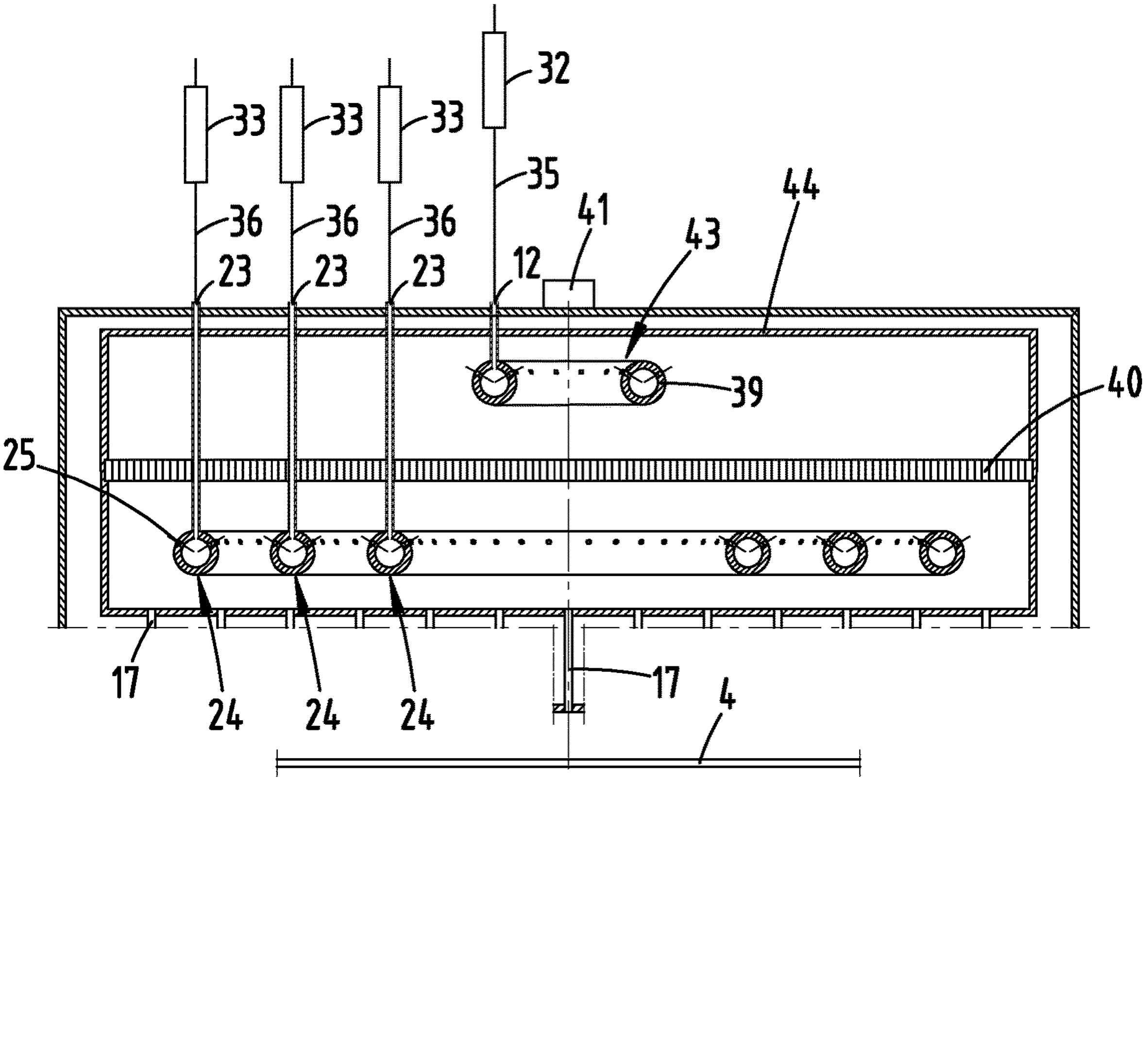
FIG. 17 shows, in an illustration in accordance with FIG. 1, an eleventh example embodiment.

In the example embodiment illustrated in FIG. 17, the gas distribution volume 11 is divided by a restrictor plate 40 into an upper section and a lower section. The gas distribution element 43 is arranged in the upper section, with which element a reactive gas, together with an inert gas, is fed into the upper section. In the lower section, a plurality of annular gas distribution elements 24 are arranged, which lie in a common plane. Here, the gas distribution elements 24 lie in a different plane than that of the gas distribution element 43. In this example embodiment, only a carrier gas can be fed through the gas distribution elements 24 arranged in the lower section, into the lower section of the gas distribution volume 11, as a means for the dilution of the process gas.

The gas distribution elements are illustrated in the example embodiments as annularly closed, or horseshoe-shaped, pipes. However, the gas distribution elements can also have a different shape, for example cavities, which are surrounded by a wall that has openings so that a process gas can be fed into the gas distribution volume over a larger surface.

The above statements serve to explain the inventions covered by the application as a whole, which in each case also independently advance the prior art at least by means of the following combinations of features, wherein two, a plurality, or all, of these combinations of features can also be combined, namely:

A method, which is characterized in that at at least a second infeed point 23, 26, a further gas, which differs from the process gas, is fed into the same gas distribution volume such that zones with a different concentration of the reactive gas are formed within the gas distribution volume 11.

A device, which is characterized in that the mouths of the infeed points 23, 26 are arranged, and the mass flow controllers 32, 33, 34, 37 are connected, in such a way that zones with different concentrations of the reactive gas are formed within the gas distribution volume 11.

A method, which is characterized in that the two gas flows contain different reactive gases, or the same reactive gas in different concentrations, in a carrier gas.

A method, which is characterized in that the first and second gas inlet openings 39, 25, 28 are arranged, and the first and second gas flows are adjusted, such that the gas flows exiting from the gas outlet openings 16 have a constant concentration of the reactive gas in the carrier gas, in an azimuthal direction with respect to a center of the gas outlet surface 6', and have different concentrations of the reactive gas in the carrier gas in a radial direction, with respect to the center.

A method, which is characterized in that at least one of the two gas flows contains a carrier gas, with which the reactive gas is diluted, or in that each of the at least two gas flows contains the reactive gas in different concentrations in the carrier gas.

A method, which is characterized in that only a carrier gas is fed into the gas distribution volume 11 through the second gas inlet ports 25, 28.

A method, which is characterized in that the reactive gas has an element of the III$^{rd}$ main group, and a second reactive gas, which has an element of the V$^{th}$ main group, is fed into a second gas distribution volume 13, and in that both reactive gases are fed into the process chamber 8 through gas outlet openings 16.

A method, which is characterized in that gas flows of the reactive gas in different concentrations are fed in the carrier gas into the process chamber 8 in at least three, four, or five, zones arranged concentrically about a center.

A method, which is characterized in that the concentration of the reactive gas in at least one of the plurality of gas flows is altered during the deposition of the at least one layer 4.

A method, which is characterized in that during the deposition of the layer, a deflection of the substrate 4 is observed, and, as a function of the degree of deflection of the substrate 4, the concentration of the reactive gas in at least one of the plurality of gas flows is altered.

A method, which is characterized in that the gas distribution volume 11 is divided with a restrictor plate 40 into an upper section and a lower section, wherein the first gas flow is fed into the upper section and the second gas flow is fed into the lower section, or both gas flows are fed into the upper section.

A method, which is characterized in that a process gas flow, consisting of a carrier gas and the reactive gas, is evenly divided into the one, or plurality of, gas flows, and an additional carrier gas is fed into at least one of the gas flows for purposes of dilution.

A method, which is characterized in that the additional carrier gas is at most 2% or 1% of the process gas flow.

A method, which is characterized in that a gas distribution element 24, 27, 43 is used to feed the first and/or second gas flow, which gas distribution element has gas inlet openings 39, 28, from which a gas flow enters the gas distribution volume 1, which gas flow has a directional component parallel to the plane in which the gas outlet surface 6' extends, and/or which gas flow has a directional component directed away from the gas outlet surface 6'.

A device, which is characterized in that the mass flow controllers 32, 33, 34, 37 are arranged such that either two mutually different reactive gases, or the same reactive gas in different concentrations, are fed in the carrier gas into the gas distribution volume 11 through the two feed lines 35; 36, 38.

A device, which is characterized in that the gas source 30 of the reactive gas is fluidically connected to both the first feed line 35 and the second feed line 36, 38, and the gas source 31 of the carrier gas is fluidically connected to at least one of the first or second feed lines 35; 36, 38, or in that a further gas source of the reactive gas is fluidically connected to the second feed line 36, 38.

A device, which is characterized in that second gas inlet ports 25, 28, fluidically connected to the second feed line 36, 38, are arranged on a concentric line, or in a concentric zone, about a geometric center of the gas outlet surface 6'.

A device, which is characterized in that one, or a plurality of, second feed lines 36, 38 open out into a gas distribution element 24, 27 which is a volume arranged in the gas distribution volume 11, which volume forms the second gas inlet openings 25, 28, and in that the one, or plurality of, gas distribution elements 24, 27, 43 extend in a zone running concentrically about a geometric center of the gas outlet surface 6'.

A device, which is characterized in that the at least one first gas inlet opening 39 opens out into an upper section of the gas distribution volume 11, and in that the second feed lines 36, 38 open out into a lower section of the gas distribution volume 11, which is separated from the upper section by a restrictor plate 40.

A device, which is characterized in that the gas distribution volume 11 is connected to a gas source 30 in which is stored a reactive gas, which has an element of the III$^{rd}$ main group, and in that a second gas distribution volume 13, which is fluidically connected to gas outlet openings 16 arranged in the gas outlet surface 6', is connected to a gas source in which is stored a second reactive gas, which has an element of the V$^{th}$ main group.

A device, which is characterized in that the first gas inlet opening 39 is assigned to a central gas inlet point 12, or a plurality of first gas inlet openings 39 are assigned to a central gas distribution element 43, and in that the second gas inlet openings 28 are formed by at least one gas distribution element 24, 27, which gas distribution element 24, 27, in the manner of a volume arranged in the gas distribution volume 11, distributes the second gas flow fed into the gas distribution element 24, 27 at at least one gas inlet point 23, 26, into the gas distribution volume.

A device, which is characterized in that the first or second gas inlet ports 25, 28, 39 generate a gas flow with a flow direction, which has a directional component, which is transverse to the flow direction of the gas flow from the gas distribution volume 11 to the gas outlet surface 6', and/or which is directed away from the gas outlet surface 6'.

A device, which is characterized in that the gas distribution element 24, 27 extends along a concentric line about the geometric center of the gas outlet surface 6', and has a multiplicity of gas inlet openings 25, 28, opening out into an annular zone about the geometric center.

A device, which is characterized in that two, three, four, or five, gas distribution elements 24, 27 are arranged concentrically about the central gas inlet point 12, or about a central gas inlet element.

A device, which is characterized in that a measuring device 41 is provided, with which a deflection of the substrate 4 can be measured, and in that a control device 42 is provided, with which the concentration of the reactive gas in the first or second gas flow is altered, as a function of the deflection of the substrate 4.

A device, which is characterized in that a first infeed point 12 for purposes of feeding the first gas flow is arranged in a center of the gas distribution volume 11, and in that two second infeed points 23 for purposes of feeding the second gas flow are in each case arranged at an end of the gas distribution volume 11.

All disclosed features are essential to the invention (individually, but also in combination with each other). The disclosure of the application hereby also includes the full disclosure content of the associated/attached priority documents (copy of the previous application), also for the purpose of including features of these documents in the claims of the present application. The subsidiary claims, even without the features of a claim referred to, characterize with their features independent inventive developments of the prior art, in particular in order to make divisional applications on the basis of these claims. The invention specified in each claim can additionally have one or more of the features specified in the above description, in particular those provided with reference numerals, and/or in the list of reference numerals. The invention also relates to forms of design, in which individual features cited in the above description are not realized, in particular to the extent that they can recognizably be dispensed with for the respective intended use, or can be replaced by other means having the same technical effect.

LIST OF REFERENCE SYMBOLS

1 Reactor housing, CVD reactor
1' CVD reactor
2 Housing wall
3 Susceptor
4 Substrate
5 Heating device
6 Gas outlet element
6' Gas outlet surface
7 Gas outlet
8 Process chamber

9 Shield plate
10 Gas inlet element
11 Gas distribution volume
12 Central gas inlet point, infeed point
12' Central gas inlet point, infeed point
12" Central gas inlet point, infeed point
13 Gas distribution volume
14 Coolant chamber
15 Gas outlet plate
16 Gas outlet opening
17 Tubes
18 Separating plate
19 Gas outlet opening
20 Tubes
21 Separating plate
23 Peripheral gas inlet point, infeed point
24 Gas distribution element
25 Gas inlet opening
26 Peripheral gas inlet point, infeed point
27 Gas distribution element
28 Gas inlet opening
30 Gas source, reactive gas
30' Gas source, reactive gas
31 Gas source, carrier gas/inert gas
32 Mass flow controller
32' Mass flow controller
33 Mass flow controller
33' Mass flow controller
34 Mass flow controller
35 Feed line
35' Feed line
36 Feed line
37 Mass flow controller
38 Feed line
39 Gas inlet opening
40 Restrictor plate, flow barrier
41 Optical measuring device
42 Control device
43 Gas distribution element
44 Upper wall

The invention claimed is:

1. A method for depositing a layer on at least one substrate (4), the method comprising:

feeding a first gas flow, which includes a first reactive gas, through at least one first gas inlet opening (39) into a first gas distribution volume (11) of a gas inlet element (10);

feeding at least one second gas flow, which includes a second reactive gas, through a plurality of second gas inlet opening (25, 28) into one or more of the first gas distribution volume (11) or a second gas distribution volume (13) of the gas inlet element (10), wherein either the first and second reactive gases are different from one another, or if the first reactive gas is identical to the second reactive gas, a concentration of the first reactive gas in the first gas flow differs from a concentration of the second reactive gas in the second gas flow;

feeding the first and second reactive gases into a process chamber (8) through a plurality of gas outlet openings (16) of a gas outlet surface (6') of the gas inlet element (10);

depositing the layer on a surface of the at least one substrate (4) with products of a physical or chemical reaction of the first and second reactive gases that have entered the process chamber (8);

disposing, in the gas inlet element (10), the at least one first gas inlet opening (39) adjacent to a center of the gas outlet surface (6') or at respective radial distances from the center of the gas outlet surface (6') and the plurality of the second gas inlet openings (25, 28) at a larger radial distance than that of the at least one first gas inlet opening (39); and adjusting the first and second gas flows such that, with respect to the center of the gas outlet surface (6'), gas flows emerging from the gas outlet openings (16) exhibit (i) a substantially constant concentration of at least the first or second reactive gas along circumferential paths about the center of the gas outlet surface (6') and (ii) a concentration that varies as a function of radial distance from the center of the gas outlet surface (6'), wherein, responsive to a curvature of the at least one substrate (4), the adjustment yields a higher or lower partial pressure of the first reactive gas at locations nearer to the center of the gas outlet surface (6') than at locations farther from the center of the gas outlet surface (6'), thereby causing a growth rate at locations of the surface of the at least one substrate (4) having smaller radial distance from the center of the gas outlet surface (6') to be greater or smaller than a growth rate at locations having larger radial distance.

2. The method of claim 1, wherein the first reactive gas has an element of main group III, and the second reactive gas, which has an element of main group V, is fed into the second gas distribution volume (13).

3. The method of claim 1, wherein in at least three, four or five zones arranged concentrically about a center of the gas inlet element (10), the first reactive gas is fed into the process chamber (8) in differing concentrations.

4. The method of claim 1, wherein the mixing ratio of the first reactive gas relative to the first carrier gas in the first gas flow is adjusted during the deposition of the layer (4) or the mixing ratio of the second reactive gas relative to the second carrier gas in the second gas flow is adjusted during the deposition of the layer (4).

5. The method of claim 1, wherein the at least one second gas inlet opening (25, 28) is oriented on a gas distribution element (24, 27) such that when the second gas flow is fed into the first gas distribution volume (11) through the at least one second gas inlet opening (25, 28), the second gas flow flows in a direction oblique to a plane in which the gas outlet surface (6') extends.

6. A device for depositing a layer on at least one substrate (4), the device comprising:

a process chamber (8);

a gas inlet element (10) comprising a first gas distribution volume (11), a second gas distribution volume (13), and a gas outlet surface (6') facing the process chamber (8), the gas outlet surface (6') having a plurality of gas outlet openings (16) fluidically connected to the first gas distribution volume (11) and the second gas distribution volume (13);

a susceptor (3) with a support side facing the process chamber (8) for supporting the at least one substrate (4);

a gas mixing system;

mass flow controllers (32, 33, 34, 37);

at least one reactive gas source (30) for supplying a first reactive gas and a second reactive gas;

a carrier gas source (31) for supplying a carrier gas;

a first feed line (35) with at least one first gas inlet opening (39) for feeding a first gas flow, which includes the first reactive gas, into the first gas distribution volume (11);

a second feed line (36, 38) with at least one second gas inlet opening (25, 28) for feeding a second gas flow, which includes the second reactive gas, into one or more of the first gas distribution volume (11) or the second gas distribution volume (13), wherein either the first and second reactive gases are different from one another, or if the first reactive gas is identical to the second reactive gas, the mass flow controllers (32, 33, 34, 37) are configured to control a concentration of the first reactive gas in the first gas flow to be different from a concentration of the second reactive gas in the second gas flow, wherein the at least one first gas inlet opening (39) is disposed adjacent to a center of the gas outlet surface (6') or at respective radial distances from the center of the gas outlet surface (6') and the plurality of the second gas inlet openings (25, 28) are disposed at a larger radial distance than that of the at least one first gas inlet opening (39);

a measuring device (41) for determining a degree of deflection of the substrate (4); and a control device (42) configured to, in response to the degree of deflection of the substrate (4), adjust the first and second gas flows such that, with respect to the center of the gas outlet surface (6'), gas flows emerging from the gas outlet openings (16) exhibit (i) a substantially constant concentration of at least the first or second reactive gas along circumferential paths about the center of the gas outlet surface (6') and (ii) a concentration that varies as a function of radial distance from the center of the gas outlet surface (6'), wherein, responsive to a curvature of the at least one substrate (4), the adjustment yields a higher or lower partial pressure of the first reactive gas at locations nearer to the center of the gas outlet surface (6') than at locations farther from the center of the gas outlet surface (6'), thereby causing a growth rate at locations of the surface of the at least one substrate (4) having smaller radial distance from the center of the gas outlet surface (6') to be greater or smaller than a growth rate at locations having larger radial distance.

7. The device of claim 6, wherein either:

(i) the at least one reactive gas source (30) comprises a first reactive gas source (30) that supplies the first reactive gas to the first feed line (35) and supplies the second reactive gas to the second feed line (36, 38), and the carrier gas source (31) is fluidically connected to at least one of the first or second feed lines (35; 36, 38) or (ii) the at least one reactive gas source (3) comprises the first reactive gas source (30) that supplies the first reactive gas to the first feed line (35) and comprises a second reactive gas source that supplies the second reactive gas to the second feed line (36, 38).

8. The device of claim 6, wherein the at least one second gas inlet opening (25, 28) comprises openings that are arranged on a concentric line, or in a concentric zone about a geometric center of the gas outlet surface (6').

9. The device of claim 6, further comprising a gas distribution element (24, 27) arranged in the first gas distribution volume (11), the at least one second gas inlet opening (25, 28) formed on a surface of the gas distribution element (24, 27), and the gas distribution element (24, 27) extending in a zone running concentrically about a geometric center of the gas outlet surface (6').

10. The device of claim 6, wherein the at least one first gas inlet opening (39) opens out into an upper section of the first gas distribution volume (11), and the second feed line (36, 38) opens out into a lower section of the first gas distribution volume (11), which is separated by a restrictor plate (40) from the upper section.

11. The device of claim 6, wherein the at least one reactive gas source (30) comprises a first reactive gas source and a second reactive gas source, wherein the first gas distribution volume (11) is connected to the first reactive gas source (30) in which is stored the first reactive gas, which has an element of main group III, and wherein the second gas distribution volume (13) is connected to the second reactive gas source in which is stored the second reactive gas, which has an element of main group V.

12. The device of claim 6, wherein the at least one first gas inlet opening (39) is assigned to a central gas inlet point (12), or to a first gas distribution element (43) arranged in the gas distribution volume (11), wherein the at least one second gas inlet openings (28) are formed by a second gas distribution element (24, 27) arranged in the first gas distribution volume (11), and wherein the second gas distribution element (24, 27) comprises at least one gas inlet point (23, 26) for receiving the second gas flow.

13. The device of claim 6, wherein the at least one second gas inlet opening (25, 28) is oriented on a gas distribution element (24, 27) such that when the second gas flow is fed into the first gas distribution volume (11) through the at least one second gas inlet opening (25, 28), the second gas flow flows in a direction oblique to a plane in which the gas outlet surface (6') extends.

14. The device of claim 6, further comprising a gas distribution element (24, 27) extending along a concentric line about a geometric center of the gas outlet surface (6'), wherein the at least one second gas inlet opening (25, 28) is formed by the gas distribution element (24, 27) and opens out into an annular zone of the first gas distribution volume (11) about the geometric center of the gas outlet surface (6').

* * * * *